United States Patent [19]

Archer

[11] 4,365,171

[45] Dec. 21, 1982

[54] LOW LOSS SNUBBER CIRCUIT

[75] Inventor: William R. Archer, Ft. Wayne, Ind.

[73] Assignee: General Electric Company, Fort Wayne, Ind.

[21] Appl. No.: 219,735

[22] Filed: Dec. 23, 1980

[51] Int. Cl.³ .................. H03K 17/08; H03K 17/64
[52] U.S. Cl. ............................ 307/253; 307/542;
307/565; 363/20; 361/91
[58] Field of Search ............ 307/253, 542, 546, 555,
307/561, 565; 363/18–21, 56; 361/91, 118, 159

[56] References Cited

U.S. PATENT DOCUMENTS 3,571,614  3/1971  Rolstead .......................... 307/253
4,016,482  4/1977  Cielo et al. ....................... 363/56
4,268,898  5/1981  Brown ............................. 363/56

Primary Examiner—John Zazworsky
Attorney, Agent, or Firm—Robert J. Mooney

[57] ABSTRACT

An improved snubber circuit for a bipolar switching transistor connected to drive an inductive transformer load comprises a first resonant circuit connected to the driven winding of the transformer and a second resonant circuit connected to a clamp winding of the transformer. At turn-off, the two resonant circuits provde an alternate current path for inductive currents to thereby limit the voltage applied to the load transistor. The circuit are interconnected to minimize component count in a manner which permits resetting the capacitive components to improve snubbing capability.

3 Claims, 4 Drawing Figures

LOW LOSS SNUBBER CIRCUIT

This invention relates to snubber circuits and, more particularly, to the use of passive non-dissipating components for limiting the voltage peaks on switching transistors.

Prior art snubber circuits for power switching transistors driving inductive loads typically utilize a diode and capacitor to shape the load line of the transistor at turn-off and a series resonant diode-inductor-capacitor circuit which serves the purpose of recharging or resetting the capacitor for the next switching cycle. An example of such a circuit is shown in the TRW Power Semiconductors Handbook, 1980 edition, at page 7-63. The deficiency in the illustrated circuit is that it does not sufficiently control the peak voltage, i.e., the overshoot voltage, on the switching transistor at turn-off. One attempt to improve this failing of the circuit where the inductive load comprises a transformer primary winding involves the addition of a secondary clamp or reset winding connected with a diode to return excess energy in the transformer magnetic core to the input supply. Although this method reduces the overshoot voltage, higher power switching circuits still tend to develop overshoot voltages of sufficient magnitude to damage or destroy the power switching transistor.

BACKGROUND OF THE INVENTION

It is an object of the present invention to provide an improved snubber circuit for a switching transistor which significantly reduces overshoot voltage.

It is a further object of the invention to provide an improved snubber circuit which reduces overshoot voltage with minimum power lost in the snubber components.

In my present invention, a switching transistor is connected to operate at a relatively high-frequency to repetitively connect and disconnect a primary winding of a power transformer across a direct current (DC) power source. A snubber circuit is connected to absorb inductive voltages generated in the transformer winding when the transistor is turned off. The snubber circuit includes a clamp or reset winding on the transformer coupled in series with a diode across the DC power source. A junction intermediate the transistor and primary winding of the transformer is coupled via a capacitor, an inductor and a pair of series connected diodes to the junction intermediate the clamp winding and its series connected diode. An additional capacitor is connected between one terminal of the power source and a junction intermediate the pair of series connected diodes. Another terminal of the power source is connected to each end of the inductor by another pair of diodes. In this arrangement, when the transistor is turned off, the magnetizing current generated in the primary winding of the power transformer is allowed to flow into the capacitor connected to the junction between the transistor and primary winding by means of one of the diodes. The value of the capacitor is selected so as to control the rate at which charge is accumulated thereby shaping the load line of the transistor. At very high power levels when the voltage would become excessive across the transistor, the diode in series with the additional transformer winding breaks over so that further energy is returned to the DC source. Because there is considerable leakage inductance between the primary winding of the transformer and the secondary clamp winding, there may be some overshoot of the voltage before it becomes clamped to the power supply voltage. To prevent this overshoot the additional capacitor is provided so that current conduction through the clamp winding begins prior to the time at which the diode begins to conduct. The inductor and one additional diode allow the two capacitors to be reset at the end of each cycle so that further snubbing can occur at the next turnoff of the transistor.

BRIEF DESCRIPTION OF THE DRAWINGS

The above and other objects and advantages of the present invention will become apparent by reference to the following detailed description taken in conjunction with the accompanying drawings in which.

DETAILED DESCRIPTION OF THE INVENTION

Figure 1:
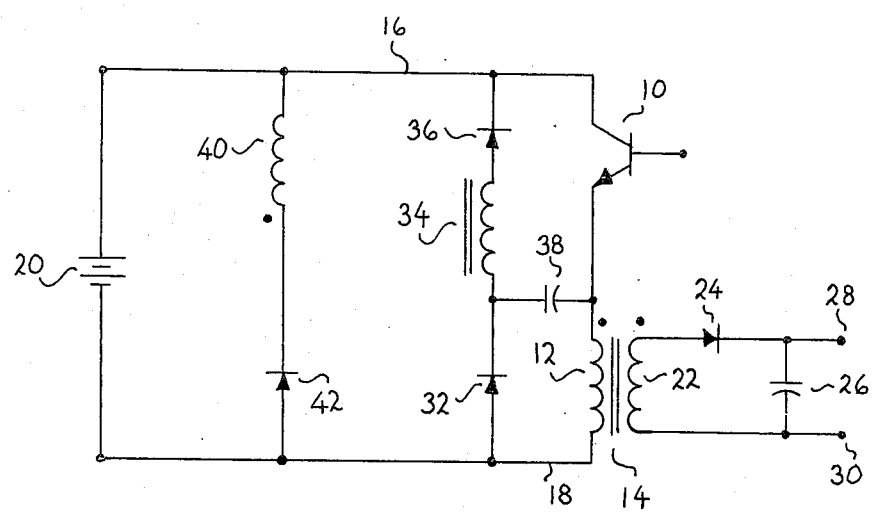
FIG. 1 is an example of a typical prior art snubber circuit for use in a high power transistor switching circuit.

Referring now to FIG. 1, there is shown a typical prior art snubber circuit for suppressing transient voltages appearing across a switching transistor in a power switching regulator circuit. A transistor 10 is connected in series with a primary winding 12 of a power transformer 14 between a positive DC bus 16 and a negative DC bus 18. A power source 20, illustrated as a battery, provides relatively positive and negative potential between the power busses 16 and 18. The transformer 14 includes a secondary winding 22 which develops an output potential for a load circuit. As shown, the load circuit may include a rectifying diode 24 and a filter capacitor 26 for developing a DC voltage at output terminals 28 and 30. A diode 32, an inductor 34 and a second diode 36 are serially connected between the DC bus 18 and DC bus 16 with the diodes being poled so as to conduct current from the negative bus 18 to the positive bus 16. The junction intermediate the diode 32 and inductor 34 is connected via a capacitor 38 to a junction intermediate the transistor 10 and primary winding 12. A secondary reset or clamp winding 40 wound on transformer 14 is serially connected with a diode 42 between the bus 18 and bus 16 with diode 42 being poled also to conduct current from bus 18 to bus 16. It should be noted that, as indicated by the dot convention, the end of the reset winding 40 adjacent bus 18 is at a positive potential when the end of the primary winding 12 disposed from the bus 18 is at a positive potential.

In the operation of the prior art circuit of FIG. 1, a gating pulse applied to a base terminal of transistor 10 gates transistor 10 into conduction and allows the DC source voltage developed between the busses 16 and 18 to be applied across the primary winding 12 of the power transformer 14. This voltage forces a current to flow through the primary winding 12 thereby delivering power to the transformer and any secondary windings connected thereto. The current through transformer winding 12 creates a leakage flux which, as is well known, will attempt to create a reverse voltage across the transformer winding when the transistor 10 is gated off. At the time that transistor 10 is gated off, the current flowing through the primary winding 12 will continue to flow through the path created by the diode 32 and capacitor 38 charging the capacitor 38 at a rate determined by the magnitude of the current through the primary winding 12 and the size of the capacitor 38. By proper selection of the value of capacitor 38, the turnoff load line can be shaped as desired. While transistor 10 is conducting, the current flowing through primary winding 12 of transformer 14 induces a voltage in reset winding 40 in a direction to reverse bias diode 42 so that no current flows through the diode 42 current path during the on-time of transistor 10.

At very high power levels, the energy transferred into capacitor 38 could result in a voltage rise on capacitor 38 to a value sufficiently high to cause damage to transistor 10. Because the winding 12 acts as a power source while capacitor 38 is charging, the voltage across winding 12 is reversed and consequently the voltage across winding 40 is also reversed. The reversal of voltage across winding 40 is in a direction to forward bias the diode 42; however, no current can flow through the diode 42 and back into the source 20 until such time as the voltage across winding 40 exceeds the source voltage. However, once the voltage across winding 40 exceeds the voltage of source 20, diode 42 becomes forward biased and current flows from winding 40 to source 20. The net effect is to limit or clamp the transient voltage in the circuit to prevent damage to transistor 10.

Due to the lack of perfect coupling between the primary winding 12 and the reset winding 40, there is a time delay associated with the transfer of energy from the winding 12 to the winding 40. At high power levels this transfer time, which is caused by unavoidable leakage reactance between the transformer windings, can be sufficiently large to permit the voltage induced in winding 12 to rise to a relatively high magnitude. This overshoot voltage appears across the transistor 10 and may cause device failure or degradation or require at least a more expensive, higher voltage component. The inductor 34 and diode 36 function to limit the nominal voltage applied to the transistor 10 by starting to conduct once the voltage on capacitor 38 exceeds the combined voltage of the source 20 and the winding 12.

However, the inductor 34 and diode 36 alone can not prevent the shorter duration transient overshoot voltage from rising to levels sufficiently high to damage transistor 10. It will therefore be appreciated that while the prior art snubber circuits have limited the sustained voltage which may appear across a switching element, these circuits have not prevented large overshoot voltages appearing, which overshoot voltages are caused by inductive reactance in the circuit.

Figure 2:
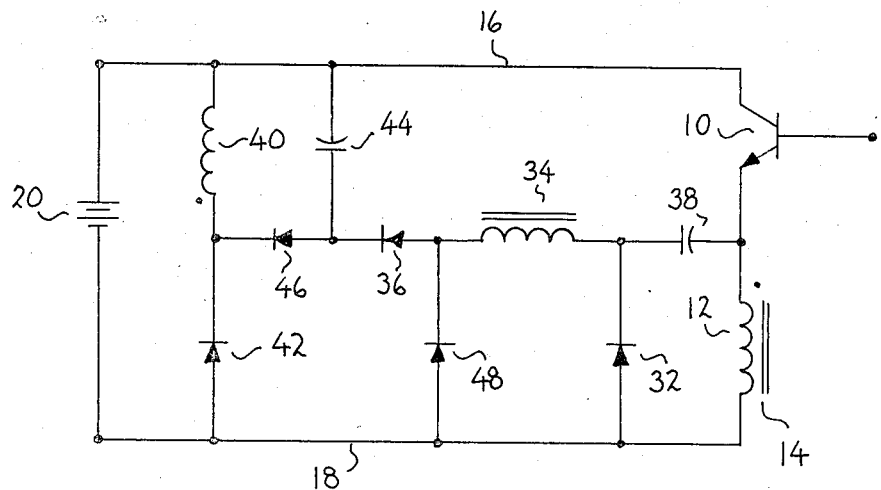
FIG. 2 is a schematic diagram of a snubber circuit in accordance with the present invention; and The two graphs designated

Referring now to FIG. 2, in which like numbers refer to like components, there is shown a preferred embodiment of the present snubber circuit which avoids undesirable overshoot voltages during transistor turnoff. As in FIG. 1, the capacitor-diode circuit, i.e. diode 32 and capacitor 38, is connected across primary winding 12. However, in this improved snubber circuit the diode 36, which in the prior art had its cathode connected directly to the positive bus 16, is now connected to the bus 16 through a capacitor 44. The cathode of diode 36 is also connected through a diode 46 to the junction intermediate diode 42 and reset winding 40. An additional diode 48 is connected between the negative bus 18 and the anode of diode 36.

In the operation of this improved snubber circuit, assuming initially that the capacitor 44 is uncharged, gating off of transistor 10 effects a reversal of voltage across primary winding 12 and also a reversal of voltage across winding 40. The voltage reversal across winding 40 creates a negative voltage at the dotted terminal which forward biases diode 46 so that a current path is formed through the capacitor-diode circuit and the clamp winding, i.e. capacitor 44, diode 46 and winding 40. Since capacitor 44 acts as a load to winding 40, the transfer of energy, i.e., current, from winding 12 to winding 40 begins immediately. By proper selection of capacitor 44 and capacitor 38 it is practical to have essentially all the current transferred into winding 40 before the voltage developed on capacitor 38 reaches the clamping level where diode 42 begins to conduct. Thus, as soon as the voltage on capacitor 38 reaches the clamping level, the current transfers from the path through capacitor 44 to the path through diode 42 and back into the source 20 without any inductive delay, thus avoiding any voltage overshoot.

Figure 3A:
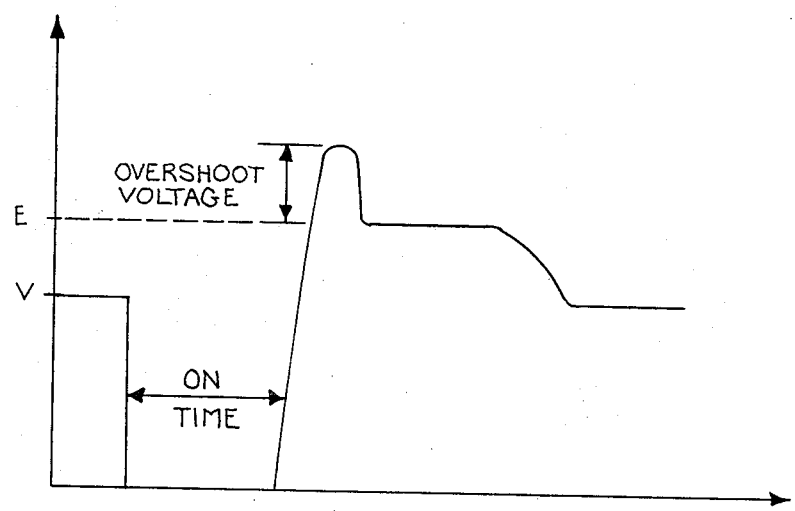
FIG. 3A and FIG. 3B, represent a set of waveforms comparing the response of the circuit according to FIG. 1 and that according to FIG. 2.
Figure 3B:
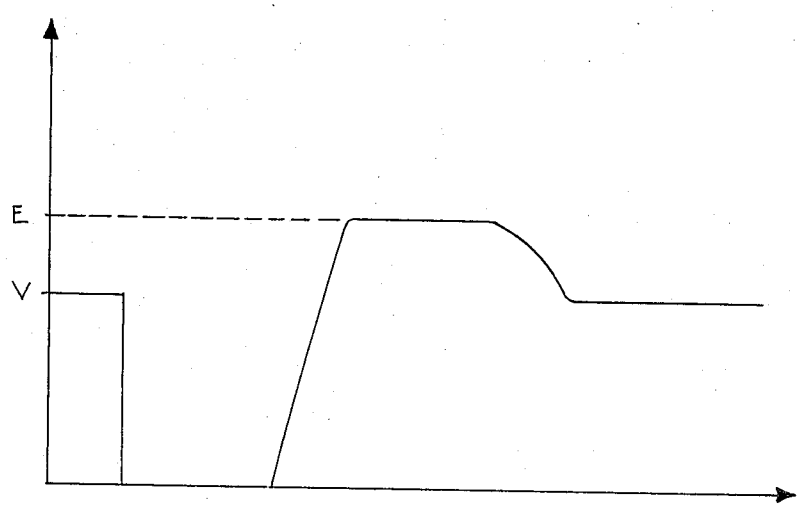

Referring briefly to FIG. 3A there is shown a wave form typically occurring in the circuit of FIG. 1. The voltage level indicated at E represents the clamping voltage, i.e., that voltage at which the diode 42 begins to conduct and limit the voltage on capacitor 38. When the off-time of transistor 10 is sufficiently long, the voltage on capacitor 38 slowly decays down to the voltage potential of the source 20 indicated at V. At initial turnoff of the transistor 10, the rising voltage on capacitor 20 overshoots the clamping voltage E as shown in FIG. 3A. As shown in FIG. 3B the improved snubber circuit of the present invention eliminates the overshoot voltage and also improves the load line shaping by slowing the rise time of the voltage on the primary winding 12.

Referring again to FIG. 2, after the turnoff cycle is complete, i.e., after current in primary winding 12 has been reduced to zero and both capacitor 38 and capacitor 44 are charged to a pedetermined voltage, it is necessary to reset the two capacitors 38 and 44 in preparation for the next cycle of operation. In the preferred embodiment a discharge path is formed from negative bus 18 through primary winding 12, capacitor 38, inductor 34, diode 36, capacitor 44 to the positive bus 16. This particular reset current path is desirable since current flow is in a direction through the primary winding 12 to drive the magnetic core of the transformer 14 into a negative flux region thus allowing the magnetic core material to be more effectively utilized. It should be noted, of course, that the capacitors 38 and 44 do not completely discharge, but rather only discharge to the point where their combined voltages are equal in magnitude to the source voltage impressed between the busses 18 and 16. Diode 36 acts to prevent the power source 20 from reversing the current thus causing the capacitors 38 and 44 to be left charged at some potential slightly below the potential between busses 18 and 16.

In order to further discharge the capacitors 38 and 44, the inventive circuit of FIG. 2 includes a high efficiency resonant tank circuit to further reset the capacitors. The series resonant circuit is formed on the next cycle of operation when the switching transistor 10 is gated into conduction forming a current path through the transistor 10, capacitor 38, inductor 34, diode 36 and capacitor 44 back through transistor 10. Since both transistor 10 and diode 36 have very low voltage drops during conduction, essentially all of the voltage from the capacitors 38 and 44 appears on the inductor 34. This voltage causes a resonant pulse of current to flow through inductor 34. The frequency of the current pulse is determined by the relative values of inductor 34 and capacitors 38 and 44, which values can be chosen to suit circuit requirements. When the capacitors have fully discharged to zero volts, all of their energy has been transferred to the inductor 34. Inductor 34 then returns the energy to the capacitors 38 and 44 by forcing the current to continue to flow after the capacitors have discharged. This current flow acts to reverse the voltage on the capacitors 38 and 44 such that the terminal of capacitor 38 connected to the emitter terminal of transtor 10 now assumes a positive potential. This action completes one-half of a normal resonant cycle. At this point, the capacitors 38 and 44 would now attempt to discharge back through the inductor 34 but such discharge is prevented by the diode 36. Diode 36 has a finite but non-zero reverse recovery time which allows a small reverse current to become established in inductor 34. As diode 36 recovers, diode 48 will conduct to prevent a high transient voltage on inductor 34. Thus, the two capacitors 38 and 44 are now held with a reverse charge of a polarity such that they are more effective on the next turnoff cycle of transistor 10.

The only power dissipation involved in resetting the charge on capacitors 38 and 44 is due to the very low losses in the diode 36, transistor 10 and inductor 34. Typically these losses are in the one to two watt range. This compares very favorably with a resistive type of discharge circuit which would be in the 20 to 30 watt range for a converter using the same type of technique illustrated in FIG. 2.

The embodiment of FIG. 2 is an improved snubber circuit for a bipolar transistor used in a single transistor converter. It will be appreciated that this improved circuit not only prevents overshoot voltages appearing on the transistor but also significantly reduces the losses inherent in a resistive discharge circuit for capacitor components normally associated with a snubber circuit. Although only a single embodiment of this invention has been described in detail, those skilled in the art will appreciate that certain modifications and variations of this embodient may be made without materially departing from the novel and advantageous features of the invention. Accordingly, all such variations and modifications are intended to be included within the scope of this invention as defined by the appended claims.

What is claimed is:

1. A voltage snubber circuit for limiting voltage overshoot during turn-off in a relatively high-frequency power switching circuit of the type including a controllable switching element connected in series with a primary winding of a power transformer across a source of DC voltage, a clamp winding coupled to the primary winding and connected via a clamping diode across the DC source for limiting the voltage applied to the switching element during turn-off and a first capacitor-diode circuit connected across the primary winding for dissipating the energy in the primary winding leakage flux during turn-off, the improvement comprising;

a second capacitor-diode circuit connected across the clamp winding for establishing current flow in the clamp winding at a voltage less than the source voltage; and means for interconnecting said first and said second capacitor-diode circuits whereby turn-on of the switching element creates a current path through at least the capacitor portions of said first and said second capacitor-diode circuits in a direction to discharge the capacitor portions of said capacitor-diode circuits preparatory to turn-off of the switching element.

2. The voltage snubber circuit of claim 1 wherein said first capacitor-diode circuit comprises a first capacitor and a first diode serially connected cross the primary winding and said second capacitor-diode circuit comprises a second capacitor and a second diode serially connected across the clamp winding.

3. The voltage snubber circuit of claim 2 wherein said interconnecting means comprises an inductor and a third diode serially connected from a junction intermediate said first capacitor and said first diode to a junction intermediate said second capacitor and said second diode, and a fourth diode connected from a junction intermediate said third diode and said inductor to one terminal of the DC voltage source.

* * * * *